US012588478B2

(12) United States Patent
Ko et al.

(10) Patent No.: US 12,588,478 B2
(45) Date of Patent: Mar. 24, 2026

(54) METHOD OF FABRICATING SEMICONDUCTOR DEVICE INCLUDING ORGANIC AND SILICON OXIDE LAYERS

(71) Applicant: Samsung Electronics Co., Ltd., Suwon-si (KR)

(72) Inventors: Eun Hyea Ko, Suwon-si (KR); Hoon Han, Suwon-si (KR); Byung Keun Hwang, Suwon-si (KR); Young Hun Sung, Suwon-si (KR); Youn Joung Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 459 days.

(21) Appl. No.: 18/312,811

(22) Filed: May 5, 2023

(65) Prior Publication Data

US 2024/0071810 A1 Feb. 29, 2024

(30) Foreign Application Priority Data

Aug. 31, 2022 (KR) ........................ 10-2022-0109560

(51) Int. Cl.
| | |
|---|---|
| *H01L 21/762* | (2006.01) |
| *H10D 30/43* | (2025.01) |
| *H10D 30/67* | (2025.01) |
| *H10D 62/10* | (2025.01) |

(52) U.S. Cl.
CPC ....... H01L 21/76224 (2013.01); *H10D 30/43* (2025.01); *H10D 30/6735* (2025.01); *H10D 62/121* (2025.01)

(58) Field of Classification Search
CPC .. H10D 84/0188; H10D 84/038; H10D 30/43; H10D 64/689; H10D 84/0177; H01L 21/76224; H01L 21/0332; C23C 16/401
See application file for complete search history.

(56) References Cited

U.S. PATENT DOCUMENTS

| | | | |
|---|---|---|---|
| 9,200,167 B2 | 12/2015 | Spence et al. | |
| 10,340,135 B2 | 7/2019 | Blanquart | |
| 10,818,658 B2 | 10/2020 | Ching et al. | |
| 10,847,363 B2 | 11/2020 | Tapily | |
| 11,101,359 B2 * | 8/2021 | Wu ................... | H01L 21/02532 |
| 2003/0104697 A1 * | 6/2003 | Chang .............. | H01L 21/02071 |
| | | | 438/689 |
| 2010/0248476 A1 | 9/2010 | Sera et al. | |
| 2020/0211857 A1 | 7/2020 | Asako | |
| 2022/0084817 A1 | 3/2022 | Sharma et al. | |

FOREIGN PATENT DOCUMENTS

KR 10-2021-0149893 A 12/2021

* cited by examiner

*Primary Examiner* — Changhyun Yi
(74) *Attorney, Agent, or Firm* — Harness, Dickey & Pierce, P.L.C.

(57) ABSTRACT

A method of fabricating a semiconductor device includes forming a first layer which has a first surface, does not contain an acid, and contains a metal material. The method includes forming, on the first layer, a second layer which includes a trench exposing the first surface. The second layer has a second surface intersecting the first surface within the trench, and contains an acid and an organic material. The method further including a first precursor containing an alkoxy group and silicon; and forming a third layer containing silicon oxide on the second surface within the trench. The third layer is in contact with a portion of the first surface within the trench.

20 Claims, 18 Drawing Sheets

1

METHOD OF FABRICATING SEMICONDUCTOR DEVICE INCLUDING ORGANIC AND SILICON OXIDE LAYERS

CROSS-REFERENCE TO RELATED APPLICATION

This application claims priority from Korean Patent Application No. 10-2022-0109560 filed on Aug. 31, 2022, in the Korean Intellectual Property Office, and all the benefits accruing therefrom under 35 U.S.C. 119, the contents of which in its entirety are herein incorporated by reference.

BACKGROUND

Example embodiments relate to a method of fabricating a semiconductor device.

Recently, along with the rapid proliferation of information media, functionality of a semiconductor is remarkably advancing. Recently developed semiconductor products can be fabricated at low cost while attaining price competitiveness and can be highly integrated for achieving high quality. In order to achieve high integration of semiconductor devices, the semiconductor devices have been gradually scaled down.

On the other hand, as a pitch size decreases, techniques for electrically isolating integrated devices have attracted attention and have been actively studied. The isolation techniques for use in the scaled devices also require or use ultra-miniaturization.

SUMMARY

Various example embodiments provide a method of fabricating a semiconductor device using selective deposition.

However, aspects of example embodiments are not restricted to those set forth herein. The above and other aspects of example embodiments will become more apparent to one of ordinary skill in the art by referencing the detailed description of the disclosure given below.

According to some example embodiments, there is provided a method of fabricating a semiconductor device, comprising forming a first layer which has a first surface, does not comprise an acid, and comprises a metal material; forming, on the first layer, a second layer which defines a trench exposing the first surface, has a second surface intersecting the first surface within the trench, and comprises an acid and an organic material; providing a first precursor comprising an alkoxy group and silicon; and forming a third layer comprising silicon oxide on the second surface within the trench The third layer is in contact with a portion of the first surface within the trench.

According to various example embodiments, there is provided a method of fabricating a semiconductor device, comprising forming, on a titanium nitride layer, an organic layer comprising an acid-precursor and an amine; forming a trench that exposes the titanium nitride layer by etching the organic layer; providing a first precursor comprising an alkoxy group and silicon and forming a silicon oxide layer on the organic layer, wherein the forming of the silicon oxide layer comprises forming a first material comprising a silanol by using hydrogen ions produced from the organic layer and the first precursor; and forming a second material comprising siloxane using the first material and the amine of the organic layer.

According to various example embodiments, there is provided a method of fabricating a semiconductor device, comprising providing a substrate comprising a first region and a second region; forming a first sheet pattern on the substrate in the first region; forming a second sheet pattern on the substrate in the second region; forming, on the substrate, a work function metal layer surrounding the first sheet pattern and the second sheet pattern; forming, on the substrate, a sacrificial layer covering the first sheet pattern and the second sheet pattern and comprising an acid-precursor and an amine; forming, between the first sheet pattern and the second sheet pattern, a trench penetrating the sacrificial layer, the trench exposing the work function metal layer; and forming, on the sacrificial layer, a protective film comprising silicon oxide. The protective film covers a surface of the sacrificial layer and the work function metal layer is exposed between the protective film within the trench.

It should be noted that the effects are not limited to those described above, and other effects of the example embodiments will be apparent from the following description.

BRIEF DESCRIPTION OF THE DRAWINGS

The above and other aspects and features will become more apparent by describing in detail various example embodiments thereof with reference to the attached drawings, in which.

DETAILED DESCRIPTION OF VARIOUS EXAMPLE EMBODIMENTS

Hereinafter, embodiments of the present disclosure will be described with reference to the attached drawings.

Figure 1:
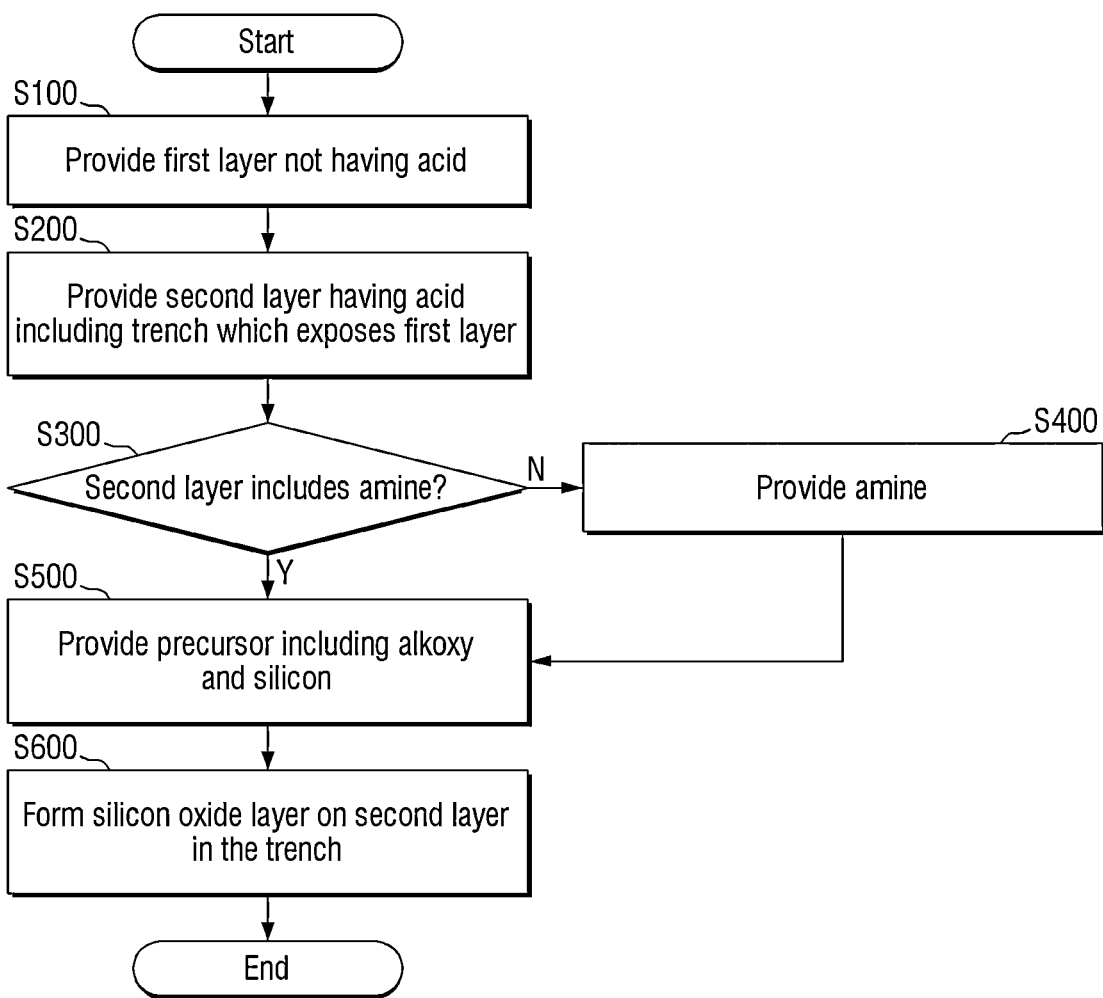
FIG. 1 is a flowchart of a method of fabricating a semiconductor device according to some embodiments.
Figure 2:
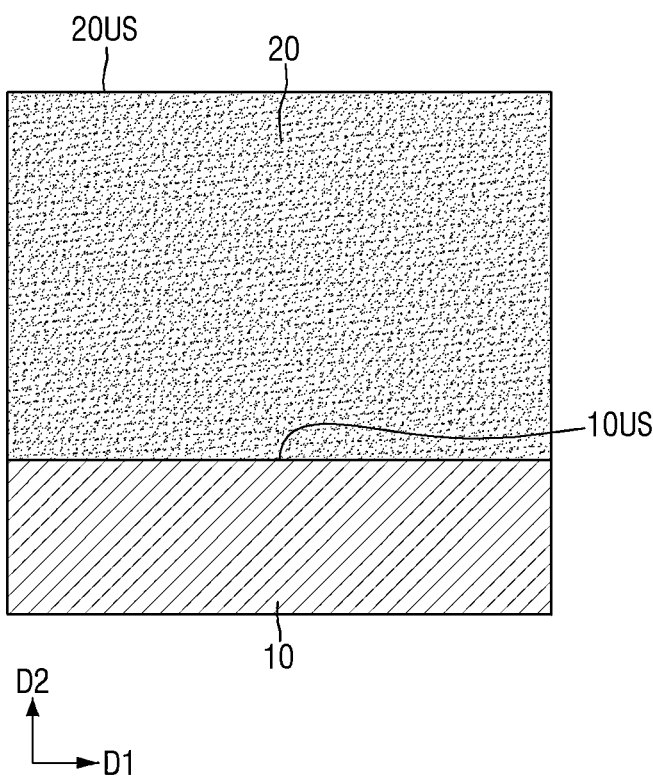
FIGS. 2 to 4 are views illustrating intermediate stages of fabrication, provided to explain a method of fabricating a semiconductor device according to some embodiments.
Figure 3:
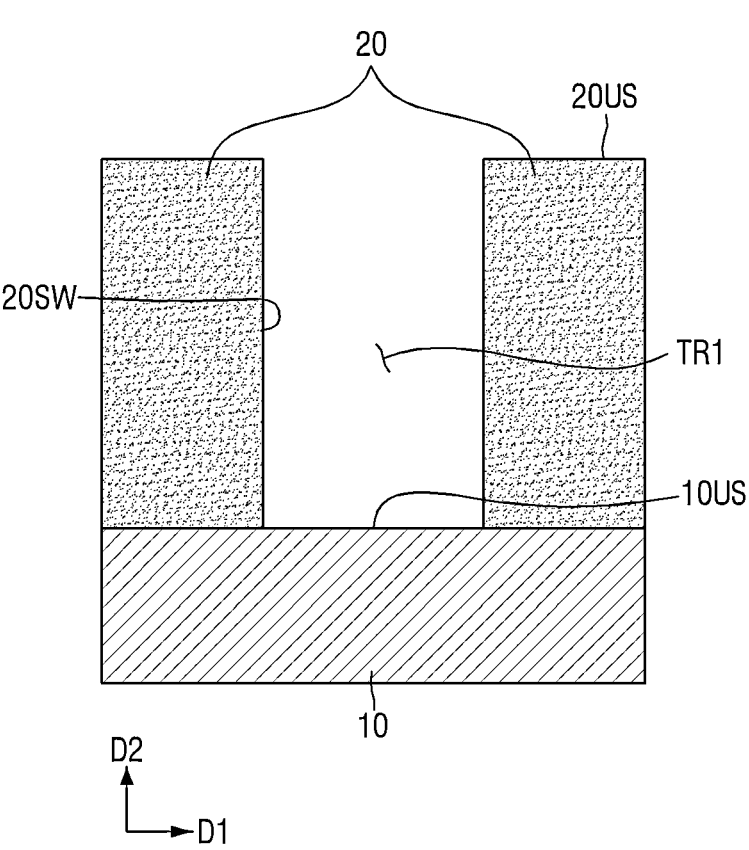
Figure 4:
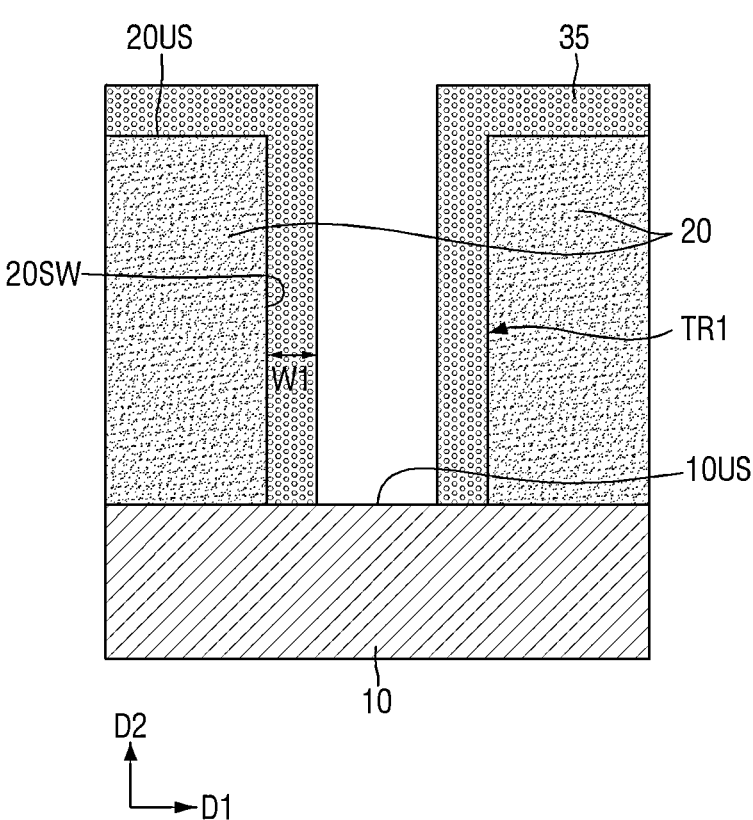

FIG. 1 is a flowchart of a method of fabricating a semiconductor device according to some example embodiments. FIGS. 2 to 4 are views illustrating intermediate stages of fabrication, provided to explain a method of fabricating a semiconductor device according to some example embodiments.

Referring to FIGS. 1 and 2, a first layer 10 is formed, and then a second layer 20 is formed (S100).

The first layer 10 may include a metal material and/or an inorganic material. For example, the first layer 10 may include titanium nitride (TiN).

The second layer 20 may include an organic material. The second layer 20 may be or may include an organic layer. The second layer 20 may include an acid-precursor. The second layer 20 including the acid-precursor may emit acid and/or hydrogen cation by stimulation such as heat, light, electromagnetic waves, or the like. For example, the second layer 20 may be or may include one or more of a gap filling insulating film, a dry etch resistance layer, a wet etch resistance layer, or a photoresist, but is not limited thereto.

The second layer 20 may be provided on the first layer 10. The second layer 20 may cover, e.g. wholly or at least partially cover, an upper surface of the first layer 10.

Referring to FIGS. 1 and 3, a first trench TR1 that penetrates the second layer 20 and exposes a first surface 10US of the first layer 10 may be formed. The exposed first surface 10US of the first layer 10 may be a bottom surface of the first trench TR1. For example, the second layer 20 may include or may define the first trench TR1 that exposes the first surface 10US.

The first trench TR1 may be formed by etching, e.g. dry and/or wet etching, the second layer 20 in a second direction D2. The first trench TR1 may expose a second surface 20SW of the second layer 20. For example, the second surface 20SW of the second layer 20 may be a sidewall of the second layer 20 or a sidewall of the first trench TR1.

In some example embodiments, the first surface 10US of the first layer 10 may extend in a first direction D1, and the second surface 20SW of the second layer 20 may extend in the second direction D2. The first direction D1 and the second direction D2 may cross each other. The first direction D1 and the second direction D2 may be substantially perpendicular to each other; however, example embodiments are not limited thereto.

The first surface 10US of the first layer 10 may include a hydroxyl group and/or an amine group through a surface pretreatment process, for example, through one or more of a dry etching process, a wet etching process, or a wet cleaning process. Alternatively or additionally, the first surface 10US of the first layer 10 may include a metal or a combination of a metal and an organic polymer. For example, the first surface 10US of the first layer 10 may include a combination of titanium nitride (TiN) and an organic polymer, and may include a hydroxyl group and/or an amine group through one or more of a dry etching process, a wet etching process, or a wet cleaning process.

The second layer 20 may include an acid-precursor. When a stimulus, such as one or more of heat, light, electromagnetic waves, or the like, is applied to the second layer 20, the second layer 20 may produce an acid and/or hydrogen ions (H+). The second surface 20SW of the second layer 20 may include a hydroxyl group and/or an amine group that are generated through a surface pretreatment process, for example, one or more of a dry etching process, a wet etching process, or a wet cleaning process.

Then, when the second layer 20 includes an amine (S300), a first precursor including an alkoxy group and silicon is provided (S500).

For example, the first precursor including an alkoxy group and silicon is tetramethyl orthosilicate, (3-mercaptopropyl) trimethoxysilane, (3-mercaptopropyl)triethoxysilane, tetraethyl orthosilicate, etc.

The first precursor including an alkoxy group and silicon may include an amine. For example, the first precursor including an amine may include an amine connected to a silicon atom. For another example, the first precursor including an amine may include an amine not connected to a silicon atom. For example, the first precursor including an amine may not include Si—N bonds. Alternatively, the first precursor including an alkoxy group and silicon may not include an amine.

Referring back to FIG. 1, when the second layer 20 does not include an amine (S300), an amine is provided (S400).

For example, an amine may be provided through a precursor including (3-Aminopropyl)trimethoxysilane, (3-Aminopropyl)tri ethoxysilane, 1,1-Dimethoxy-N—N—N'—N'-tetramethylsilanediamine, etc.

A second precursor including an amine may include Si—N bonds. The amine included in the second precursor may be connected to or bonded to a silicon atom. A third precursor including an amine may not include Si—N bonds. The amine included in the third precursor may not be connected to a silicon atom.

When an amine is not provided in operation S300, a mixture of the second precursor including the Si—N bonds and the third precursor not including the Si—N bonds.

Referring to FIGS. 1 and 4, a silicon oxide layer 35 is formed (S600).

Specifically, the precursor including an alkoxy group and silicon provided in operation S500 may react with acids. For example, the precursor including an alkoxy group and silicon may react with hydrogen ions emitted by the second layer 20. The precursor including an alkoxy group and silicon may react with an acid to form a first material including a silanol.

The second layer 20 produces an acid and/or hydrogen ions, whereas the first layer 10 does not produce an acid or hydrogen ions. Therefore, the first material including a silanol produced by the reaction between acid and the first precursor including an alkoxy group and silicon may be formed only on the second layer 20, e.g. on the sidewall second surface 20SW and an upper surface 20US of the second layer 20, and not on an upper surface 10US of the first layer 10. The first material including a silanol produced by the reaction between acid and the first precursor including an alkoxy group and silicon may not be formed on the first layer 10.

The first material including a silanol may react with an amine to form a second material including siloxane. Thus, the first material including a silanol formed on the second layer 20 may react with an amine to form the second material including siloxane. For example, the second material including siloxane may be formed on the second layer 20. The second material including siloxane on the second layer 20 may form silicon oxide. For example, the second material including siloxane on the second layer 20 may form a silicon oxide ($SiO_2$) layer.

On the contrary, since the first layer 10 does not emit acid or hydrogen ions, the first material including a silanol may not be formed on the first layer 10. Thus, the second material including siloxane may not be formed on the first layer 10.

The silicon oxide layer 35 may be disposed on the upper surface 20US and the second surface 20SW of the second layer 20. The silicon oxide layer 35 may cover the surface of the second layer 20. The silicon oxide layer 35 may extend along a profile of the surface of the second layer 20.

The silicon oxide layer 35 may be in contact with or in direct contact with a portion, e.g. only a portion, of the first layer 10. This may be due to the silicon oxide layer 35 being formed over the entire second surface 20SW of the second layer 20 intersecting the first surface 10US of the first layer 10. For example, the silicon oxide layer 35 formed on the second surface 20SW of the second layer 20 may be in contact with a portion of the first layer 10.

The silicon oxide layer 35 may not cover the entire surface of the first layer 10. For example, the first layer 10 may be exposed between the silicon oxide layers 35.

The silicon oxide layer 35 may be formed at a temperature of 130° C. or higher and 250° C. or lower. The second layer 20 may emit acid and/or hydrogen ions at a temperature of 130° C. or higher and 250° C. or lower. The first layer 10 may not emit acid or hydrogen ions at a temperature of 130° C. or higher and 250° C. or lower.

The first precursor including an alkoxy group and silicon may react with the acid and/or hydrogen ions produced from the second layer 20 to selectively form the silicon oxide layer 35 only on, e.g. only conformally on, the second layer 20. A width W1 of the silicon oxide layer 35 may be the same on the second surface 20SW as the upper surface 20US of the second layer 20; however, example embodiments are not limited thereto. For example, even if an inhibitor layer is not formed on the first layer 10, the silicon oxide layer 35 may not be formed on the first layer 10. Accordingly, the formation and floating of the silicon oxide layer 35 on an end of the second layer 20 in contact with the first layer 10 due to the inhibitor layer formed on the first layer 10 may be prevented or reduced in likelihood of occurrence.

At a temperature of 130° C. or higher and 250° C. or lower, the silicon oxide layer 35 may be selectively formed only on the second layer 20 without a separate catalyst. The silicon oxide layer 35 may be selectively formed on the second layer 20 without a catalyst or inhibitor layer at a temperature of 130° C. or higher and 250° C. or lower using the first precursor including an alkoxy group and silicon, an amine, and the acid or hydrogen ion produced from the second layer 20.

Figure 5:
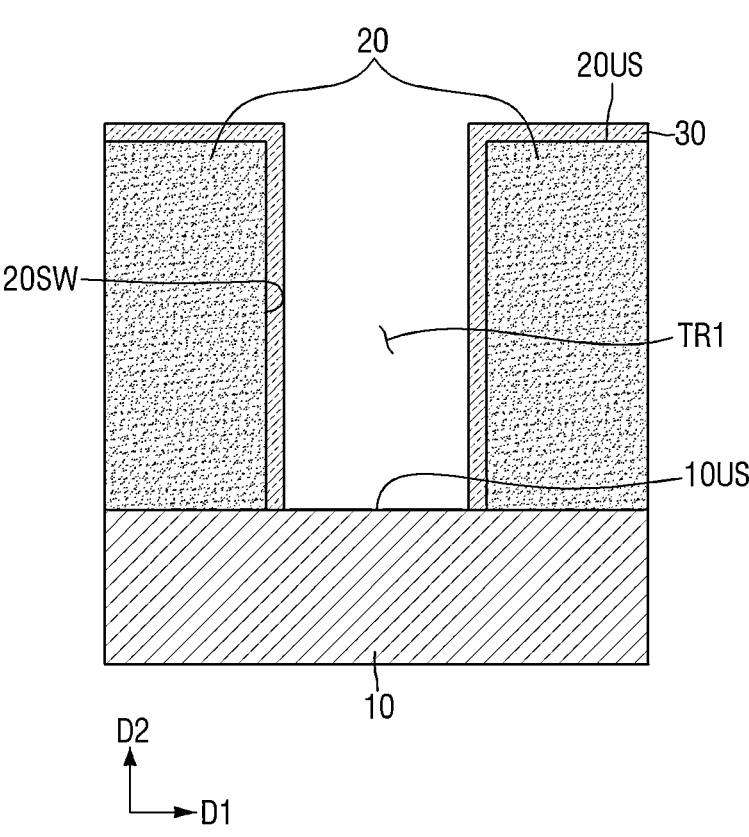
FIGS. 5 and 6 are views illustrating intermediate stages of fabrication, provided to explain a method of fabricating a semiconductor device according to some embodiments.
Figure 6:
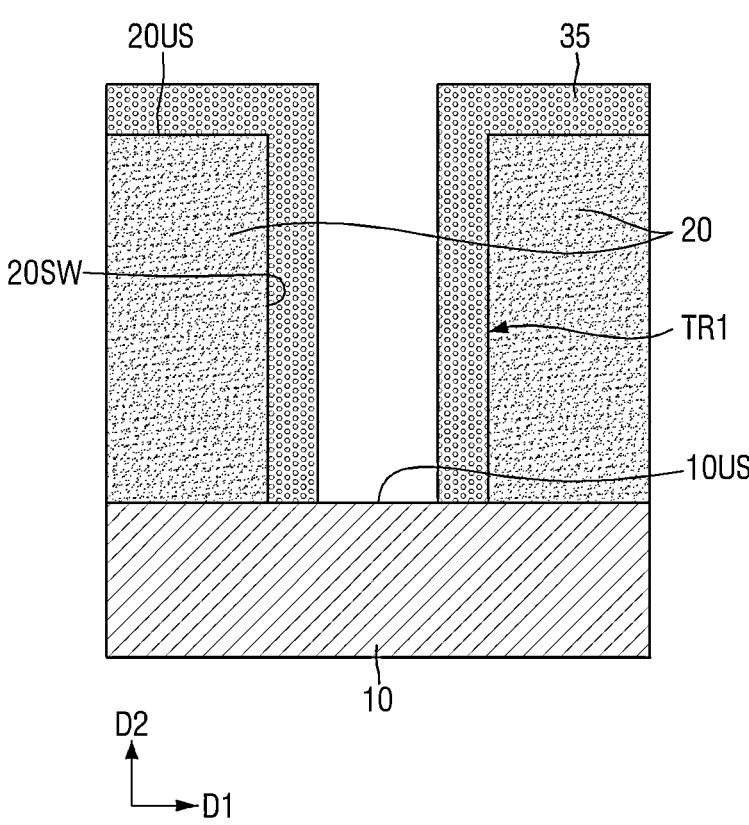

FIGS. 5 and 6 are views illustrating intermediate stages of fabrication, provided to explain a method of fabricating a semiconductor device according to some example embodiments. For reference, FIGS. 5 and 6 are views illustrating stages following the intermediate stage shown in FIG. 3. For convenience of description, the following description will focus on differences from various example embodiments shown in FIGS. 2 to 4.

Referring to FIGS. 1, 3, and 5, an intermediate layer 30 may be formed on the second layer 20.

Specifically, when the second precursor or third precursor including an amine is provided, the intermediate layer 30 may be formed on the second layer 20. The second precursor may not include Si—N bonds. The third precursor may not include Si—N bonds.

Referring to FIG. 1, whether the second layer 20 includes an amine (S300), and when the second layer 20 does not include an amine or insufficient amine is present in the second layer 20, an amine may be provided to the second layer 20 (S400). In this case, the second precursor or third precursor including an amine may be provided, e.g. may be preferentially provided before providing the first precursor including an alkoxy group and silicon is provided in operation S500.

For example, the second precursor or third precursor including an amine may include silicon. For another example, the third precursor including an amine may not include silicon.

The second precursor including an amine may form the intermediate layer 30 including an amine on the second layer 20. The intermediate layer 30 including an amine may be formed on the second surface 20SW and the upper surface 20US of the second layer 20. For example, when the third precursor not including Si—N bonds is provided, the intermediate layer 30 including Si—NH$_3$ may be formed on the second layer 20.

Referring to FIGS. 1 and 6, a silicon oxide layer 35 may be formed on the second layer 20 (S600).

Specifically, the first precursor including an alkoxy group and silicon may be provided onto the intermediate layer 30 including an amine in operation S500. The amine of the intermediate layer 30, the first precursor including an alkoxy group and silicon, and the acid or hydrogen ions emitted by the second layer 20 may react with each other to form the silicon oxide layer 35 on the second layer 20.

The first precursor provided after the formation of the intermediate layer 30 including an amine may not include an amine. For example, the first precursor provided after the formation of the intermediate layer 30 may include tetramethyl orthosilicate or tetraethyl orthosilicate. However, embodiments are not limited to this case. For example, the first precursor provided after the formation of the intermediate layer 30 including an amine may include an amine.

Figure 7:
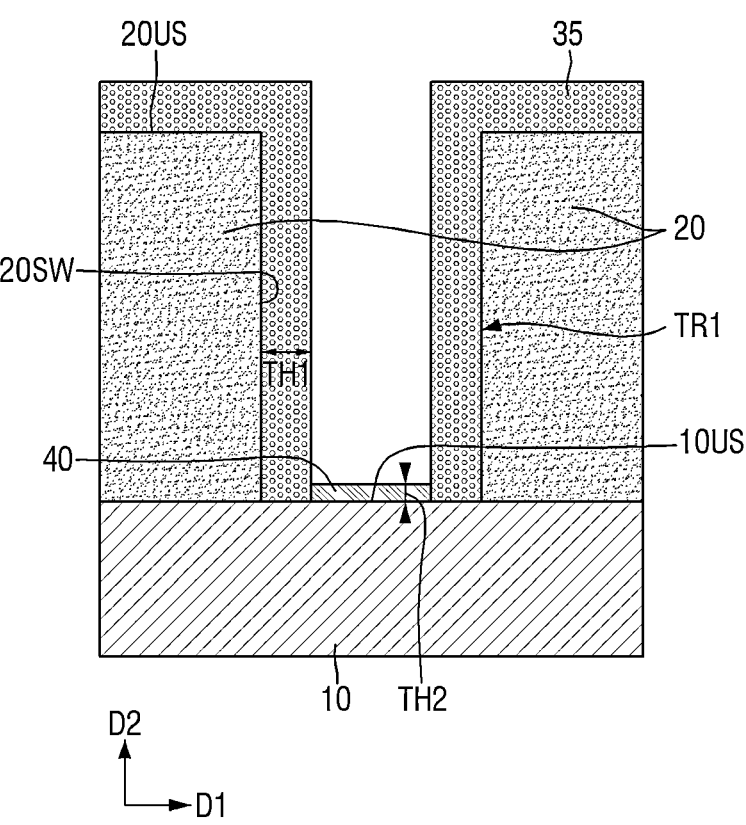
FIG. 7 is a view illustrating an intermediate stage of fabrication, provided to explain a method of fabricating a semiconductor device according to some embodiments.

FIG. 7 is a view illustrating an intermediate stage of fabrication, provided to explain a method of fabricating a semiconductor device according to some example embodiments. For reference, FIG. 7 is a view illustrating a stage following the intermediate stage shown in FIG. 3. For convenience of description, the following description will focus on differences from the embodiment shown in FIGS. 2 to 4.

Referring to FIGS. 3 and 7, the silicon oxide layer 35 may be formed on the second layer 20, and a sub-film 40 may be formed on the first layer 10.

Referring to FIG. 1, whether the second layer 20 includes an amine (S300), and when the second layer 20 does not include an amine or insufficient amine is present in the second layer 20, an amine may be provided to the second layer 20 (S400). In this case, the second precursor including an amine may be preferentially provided before providing the first precursor including an alkoxy group and silicon in operation S500. The second precursor including an amine may not include silicon.

A second precursor including an amine may include Si—N bonds. For example, the amine included in the second precursor may be connected to a silicon atom.

The second precursor including Si—N bonds may react with a hydroxyl group of the first layer 10 to form the sub-film 40 including a silanol. The second precursor including Si—N bonds may react with a hydroxyl group of the second layer 20 to form a silanol.

Since the second layer 20 emits an acid and/or hydrogen ions, the silanol on the second layer 20 formed by the second precursor including Si—N bonds may react with the acid or hydrogen ions and the first precursor including an alkoxy group and silicon to form the silicon oxide layer 35.

The first precursor including an alkoxy group and silicon provided after the silanol is formed on the first layer 10 and the second layer 20 using the second precursor including Si—N bonds may not include an amine. For example, the first precursor provided after the formation of the silanol may include Si—N bonds. For another example, the first present provided after the formation of the silanol may not include Si—N bonds but may include an amine.

The first precursor including an alkoxy group and silicon provided after the formation of the silanol on the first layer 10 and the second layer 20 using the second precursor including Si—N bonds may not include an amine. For example, the first precursor provided after the formation of the silanol may include tetramethyl orthosilicate and/or tetraethyl orthosilicate.

Since the first layer 10 does not emit an acid or hydrogen ions, the sub-film 40 including a silanol on the first layer 10 may not form the silicon oxide layer 35.

The thickness of the sub-film 40 may be less than that of the silicon oxide layer 35. The thickness TH1 of the silicon oxide layer 35 may be greater than the thickness TH2 of the sub-film 40. This may be because the silanol formed on the second layer 20 by the second precursor including Si—N bonds continuously forms the silicon oxide layer 35 using the acid or hydrogen ions emitted from the second layer 20. On the other hand, since an acid or hydrogen ions are not emitted from the first layer 10, deposition of the sub-film 40 including a silanol formed as a single layer film on the first layer 10 by the second precursor including Si—N bonds may not further proceed.

Thereafter, the sub-film 40 formed on the first layer 10 may be selectively removed. For example, the sub-film 40 on the first layer 10 may be removed using a wet etching process, and the silicon oxide layer 35 on the second layer 20 may not be removed or may not be fully removed.

FIGS. 8 to 18 are views illustrating intermediate stages of fabrication, provided to explain a method of fabricating a semiconductor device according to some example embodiments.

For reference, FIGS. 8 to 18 illustrate a transistor including nanowire or nano-sheet, which is a multi-bridge channel field effect transistor (MBCFET™), but example embodiments are not limited thereto.

A semiconductor device according to some example embodiments may include one or more fin-type field effect transistors (FinFET) including a channel region in a fin-type pattern shape, a tunneling FET, or a three-dimensional (3D) transistor. A semiconductor device according to some example embodiments may include a planar transistor. Further, the technical idea of the present disclosure may apply to 2-dimensional (2D) material based FETs and heterostructures thereof.

Also, a semiconductor device according to some example embodiments may include one or more of a bipolar junction transistor, a laterally diffused metal oxide semiconductor (LDMOS) transistor, or the like.

Figure 8:
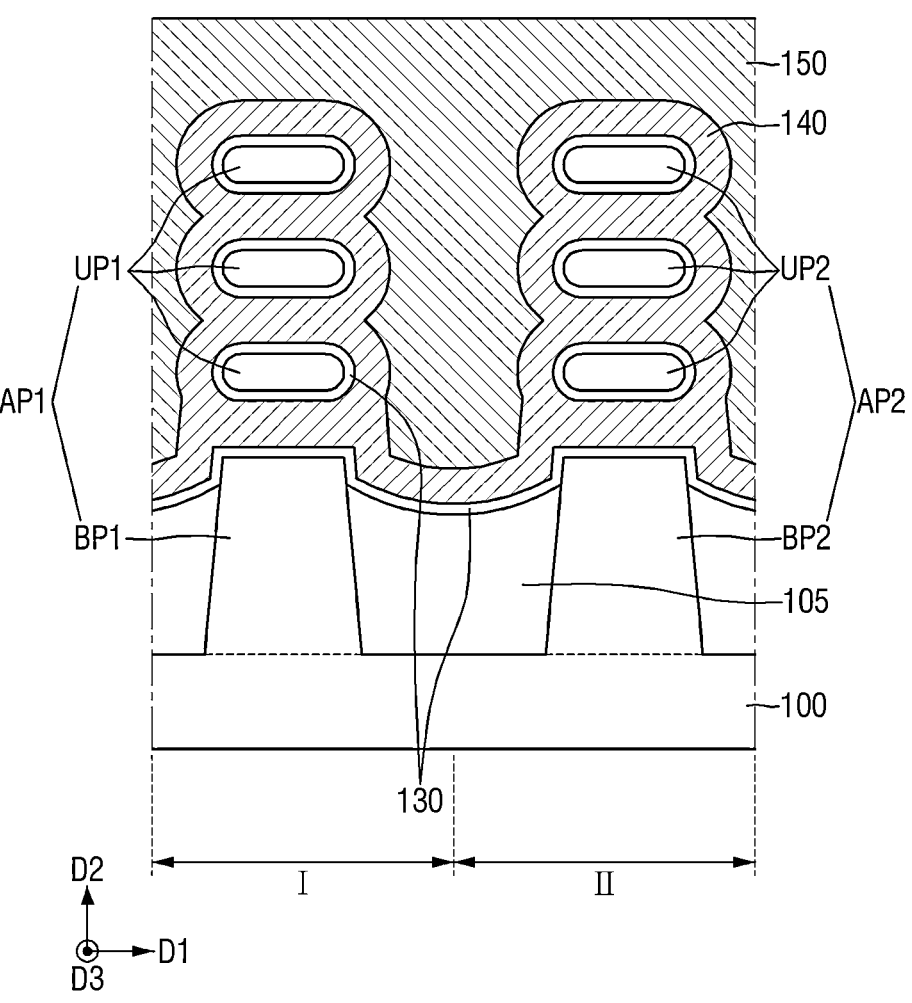
FIGS. 8 to 18 are views illustrating intermediate stages of fabrication, provided to explain a method of fabricating a semiconductor device according to some embodiments.

Referring to FIG. 8, a substrate 100 is prepared. The substrate 100 may include a first region I and a second region II. The first region I and the second region II may be adjacent to each other or spaced apart from each other.

The substrate 100 may be or may include a silicon substrate or a silicon-on-insulator (SOI) substrate. Alternatively or additionally, the substrate 100 may include, for example, silicon germanium, silicon germanium on insulator (SGOI), indium antimonide, lead tellurium compound, indium arsenide, indium phosphide, gallium arsenide, or gallium antimonide, but the example embodiments are not limited thereto.

Although not shown, the substrate 100 may include active regions and field regions. The field region may be formed between the active regions. The active regions may be isolated from each other by the field region. For example, a device isolation film may be disposed around the active region. The device isolation film may be disposed in the field region.

For example, a portion in which the channel region of a transistor, which may be an example of a semiconductor device, is formed may be the active region, and a portion that separates the channel region of the transistor formed in the active region may be the field region. Alternatively, the active region may be a portion in which nano-sheet or nanowire used as the channel region of the transistor is formed, and the field region may be a portion in which the nano-sheet or nanowire used as the channel region is not formed.

In some example embodiments, one of the first region I and the second region II may be a PMOS formation region and the other may be an NMOS formation region. In some example embodiments, both the first region I and the second region II may be PMOS formation regions. In some example embodiments, both the first region I and the second region II may be NMOS formation regions.

A first active pattern AP1 may be formed on the substrate 100 in the first region I. A second active pattern AP2 may be formed on the substrate 100 in the second region II. The portion in which the first active pattern AP1 and the second active pattern AP2 may be or may correspond to the active region.

The first active pattern AP1 may include a first lower pattern BP1 and a plurality of first sheet patterns UP1. The second active pattern AP2 may include a second lower pattern BP2 and a plurality of second sheet patterns UP2.

The first lower pattern BP1 and the second lower pattern BP2 may protrude from the substrate 10 in the second direction D2 and may extend in a third direction D3. The first lower pattern BP1 may be spaced apart from the second lower pattern BP2 in the first direction D1. The first direction D1, the second direction D2, and the third direction D3 may cross one another. The first direction D1, the second direction D2, and the third direction D3 may be parallel or substantially perpendicular to one another.

The first sheet pattern UP1 may be formed on the first lower pattern BP1. The first sheet pattern UP1 may be spaced apart from the first lower pattern BP1 in the second direction D2. There may be at least one first sheet pattern UP1. The first sheet patterns UP1 may be spaced apart from each other in the second direction D2.

The second sheet pattern UP2 may be formed on the second lower pattern BP2. The second sheet pattern UP2 may be spaced apart from the second lower pattern BP2 in the second direction D2. There may be at least one second sheet pattern UP2. The second sheet patterns UP2 may be spaced apart from each other in the second direction D2.

Although three first sheet patterns UP1 and three second sheet patterns UP2 are illustrated in the drawing, this is mere for ease of description and embodiments are not limited to this case, and there may be more or less nano sheet patterns, and the number of first sheet patterns UP1 may be the same as, or different from, the number of second sheet patterns UP2.

The first and second active patterns AP1 and AP2 may each be a part of the substrate 100 and include an epitaxial layer grown from the substrate 100. The first and second active patterns AP1 and AP2 may include, for example, silicon or germanium, which is an elemental semiconductor material. In addition, the first and second active patterns AP1 and AP2 may include a compound semiconductor, for example, a group IV-IV compound semiconductor or a group III-V compound semiconductor. The group IV-IV compound semiconductor may be, for example, a binary compound or a ternary compound, including two or more group IV elements, such as carbon (C), silicon (Si), germanium (Ge), or tin (Sn), or a compound prepared by doping a group IV element into the binary or ternary compound. The group III-V compound semiconductor may be any one of, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In some example embodiments, the first and second active patterns AP1 and AP2 may include the same material. Alternatively or additionally, in some example embodiments, the first and second active patterns AP1 and AP2 may include different materials from each other.

A field insulating film 105 may be formed between the first lower pattern BP1 and the second lower pattern BP2.

The field insulating film 105 may be formed in the field region. The first lower pattern BP1 and the second lower pattern BP2 may each be interposed between adjacent ones of the field insulating films 105. The field insulating film 105 may be formed on a portion of a side surface of the first lower pattern BP1 and a portion of a side surface of the second lower pattern BP2. The first and second lower patterns BP1 and BP2 may each protrude further upward than an upper surface of the field insulating film 105. The field insulating film 105 may include, for example, an oxide film a nitride film, an oxynitride film or a combination thereof.

A gate insulating film 130 may be formed. The gate insulating film 130 may be formed on the upper surface of the field insulating film 105, an upper surface and a portion of the side surface of the first lower pattern BP1, an upper surface and a portion of the side surface of the second lower pattern BP2, the first sheet pattern UP1, and the second sheet pattern UP2. The gate insulating film 130 may surround the first sheet pattern UP1 and the second sheet pattern UP2.

The gate insulating film 130 may include silicon oxide, silicon nitride, silicon oxynitride, or a high-k material having a higher dielectric constant than silicon oxide. The high-k material may include one or more of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

A semiconductor device according to some example embodiments may include a negative capacitance FET using a negative capacitor. For example, the gate insulating film 130 may include a ferroelectric film exhibiting a ferroelectric property and a paraelectric film exhibiting a paraelectric property.

The ferroelectric film may have a negative capacitance, and the paraelectric film may have a positive capacitance. For example, in the case where two or more capacitors are connected in series and each capacitor has a positive capacitance, a total capacitance may be reduced to a value that is less than a capacitance of each of the capacitors. In contrast, in the case where at least one of serially-connected capacitors has a negative capacitance, a total capacitance of the serially-connected capacitors may have a positive value and may be greater than an absolute value of each capacitance.

In the case where a ferroelectric film having a negative capacitance and a paraelectric film having a positive capacitance are connected in series, a total capacitance of the serially-connected ferroelectric and paraelectric films may be increased. Due to such an increase of the total capacitance, a transistor including the ferroelectric film may have a subthreshold swing (SS), which is less than 60 mV/decade, at room temperature.

The ferroelectric film may have the ferroelectric property. The ferroelectric film may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). In another example, the hafnium zirconium oxide may be a compound composed of hafnium (Hf), zirconium (Zr), and/or oxygen (O).

The ferroelectric film may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric film may vary depending on a ferroelectric material included in the ferroelectric film.

In the case where the ferroelectric film includes hafnium oxide, the dopants in the ferroelectric film may include at least one of, for example, gadolinium (Gd), silicon (Si), zirconium (Zr), aluminum (Al), and/or yttrium (Y).

In the case where the dopants are aluminum (Al), a content of aluminum in the ferroelectric film may range from 3 to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric film may range from 2 at % to 10 at %. In the case where the dopants are yttrium (Y), a content of yttrium in the ferroelectric film may range from 2 at % to 10 at %. In the case where the dopants are gadolinium (Gd), a content of gadolinium in the ferroelectric film may range from 1 at % to 7 at %. In the case where the dopants are zirconium (Zr), a content of zirconium in the ferroelectric film may range from 50 at % to 80 at %.

The paraelectric film may have the paraelectric property. The paraelectric film may be formed of or include at least one of, for example, silicon oxide and/or high-dielectric constant metal oxide. The metal oxides, which can be used as the paraelectric film, may include at least one of, for example, hafnium oxide, zirconium oxide, and/or aluminum oxide, but the present disclosure is not limited thereto.

The ferroelectric film and the paraelectric film may be formed of or include the same material. The ferroelectric film may have the ferroelectric property, but the paraelectric film may not have the ferroelectric property. For example, in the case where the ferroelectric and paraelectric films contain hafnium oxide, a crystal structure of the hafnium oxide in the ferroelectric film may be different from a crystal structure of the hafnium oxide in the paraelectric film.

The ferroelectric film may exhibit the ferroelectric property, only when its thickness is in a specific range. The ferroelectric film may have a thickness ranging from 0.5 to 10 nm, but the present disclosure is not limited thereto. Since a critical thickness associated with the occurrence of the ferroelectric property varies depending on the kind of the ferroelectric material, the thickness of the ferroelectric film may be changed depending on the kind of the ferroelectric material.

In some example embodiments, the gate insulating film 130 may include a single ferroelectric film. In some other embodiments, the gate insulating film 130 may include a plurality of ferroelectric films spaced apart from each other. The gate insulating film 130 may have a multi-layered structure, in which a plurality of ferroelectric films and a plurality of paraelectric films are alternately stacked.

A work function metal layer 140 may be formed on the substrate 100. The work function metal layer 140 may be formed on the gate insulating film 130. The work function metal layer 140 may surround the first and second sheet patterns UP1 and UP2. The work function metal layer 140 may include titanium nitride (TiN), organic polymer, and a combination thereof. The work function metal layer 140 may include, for example, a titanium nitride layer, but is not limited thereto. The work function metal layer 140 may correspond to the first layer 10 of FIG. 4.

A coating layer 150 may be formed on the work function metal layer 140. The coating layer 150 may cover the work function metal layer 140. The material included in the coating layer 150 may be the same as the material included in the work function metal layer 140. For example, the coating layer 150 may include a titanium nitride film, but is not limited thereto.

Figure 9:
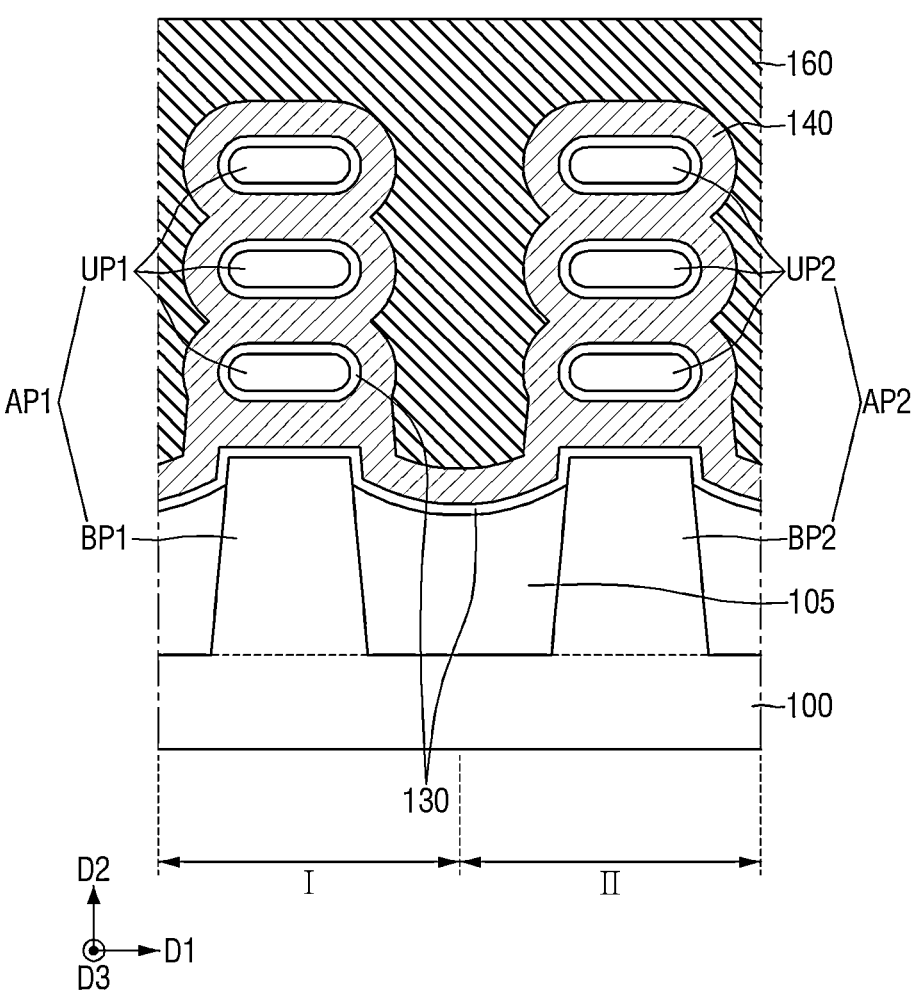

Referring to FIG. 9, a sacrificial layer 160 may be formed.

A gap-fill insulating material may be deposited on the coating layer 150. The coating layer 150 may be combined with the gap-fill insulating material to form the sacrificial layer 160. The sacrificial layer 160 may be or may correspond to the second layer 20 of FIG. 4. The surface of the sacrificial layer 160 may be of a material containing an acid-precursor. For example, the sacrificial layer 160 may include a gap filling insulating film, a dry etch resistance layer, a wet etch resistance layer, or a photoresist. When a stimulus, such as one or more of heat, light, electromagnetic waves, or the like, is applied to the sacrificial layer 160, the sacrificial layer 160 may emit an acid and/or hydrogen cations. The sacrificial layer 160 may include an organic layer that emits an acid or hydrogen cations.

Figure 10:
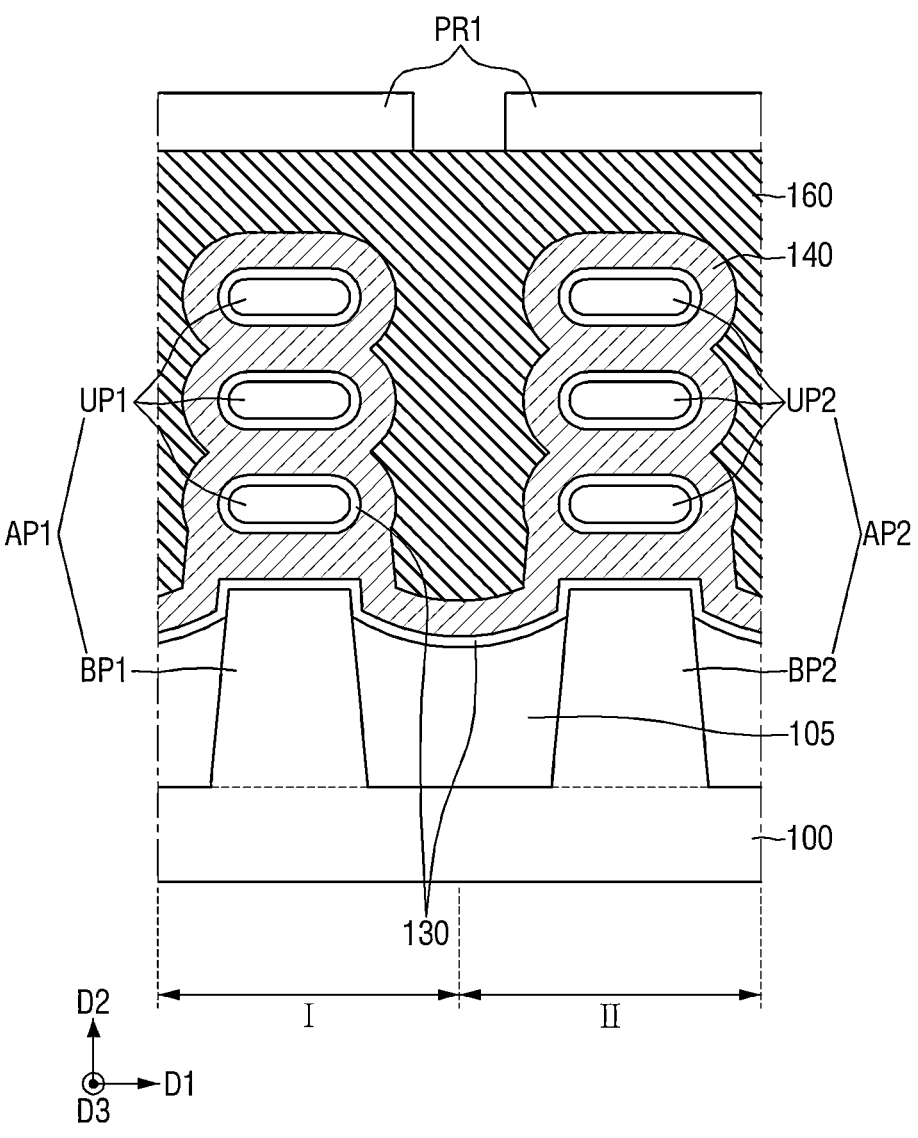

Referring to FIG. 10, a first photoresist PR1 may be formed on the sacrificial layer 160.

Figure 16:
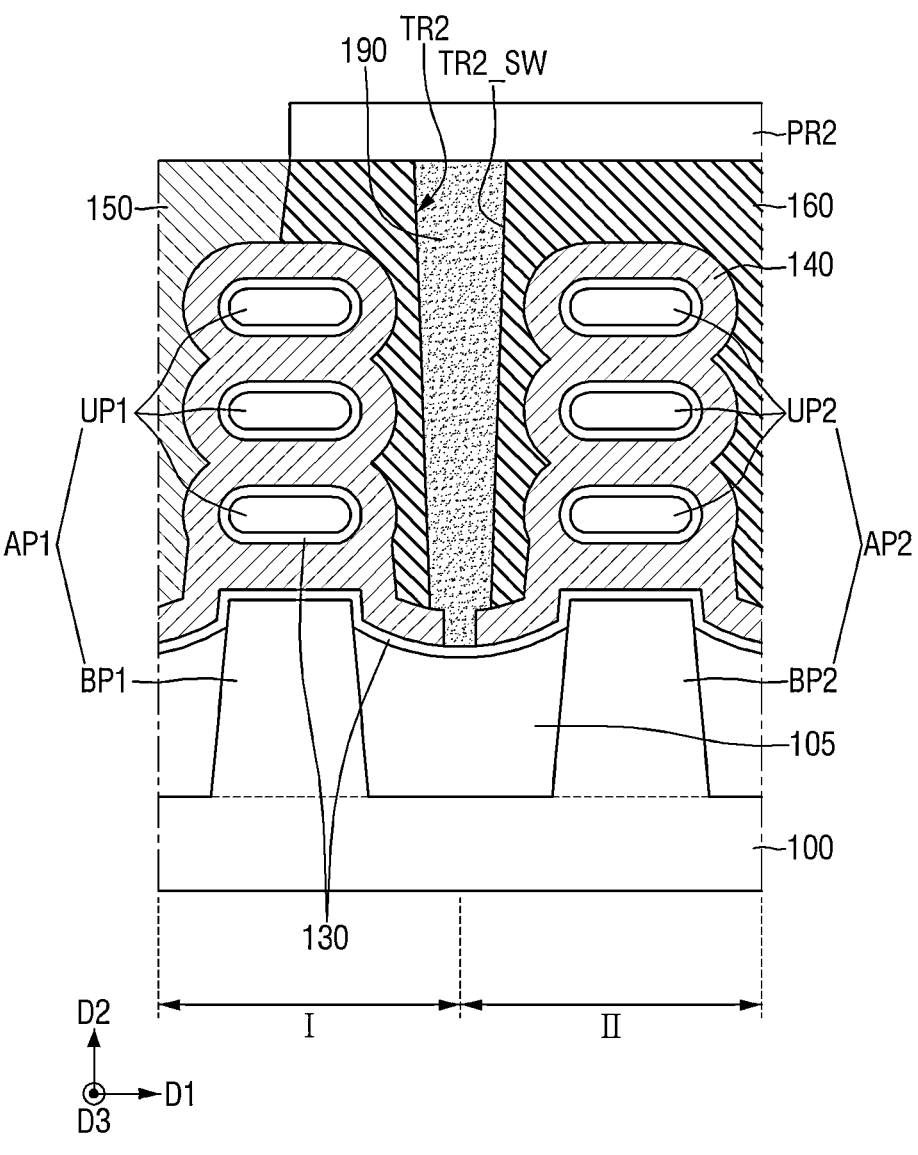

The first photoresist PR1 may have an opening that roughly defines a position of a first trench TR1 (see FIG. 16). The first photoresist PR1 may be formed of at least one of a photoresist film, an amorphous carbon layer (ACL), a spin-on hardmask (SOH) layer, a spin-on carbon (SOC) layer, and/or a silicon nitride film.

Figure 11:
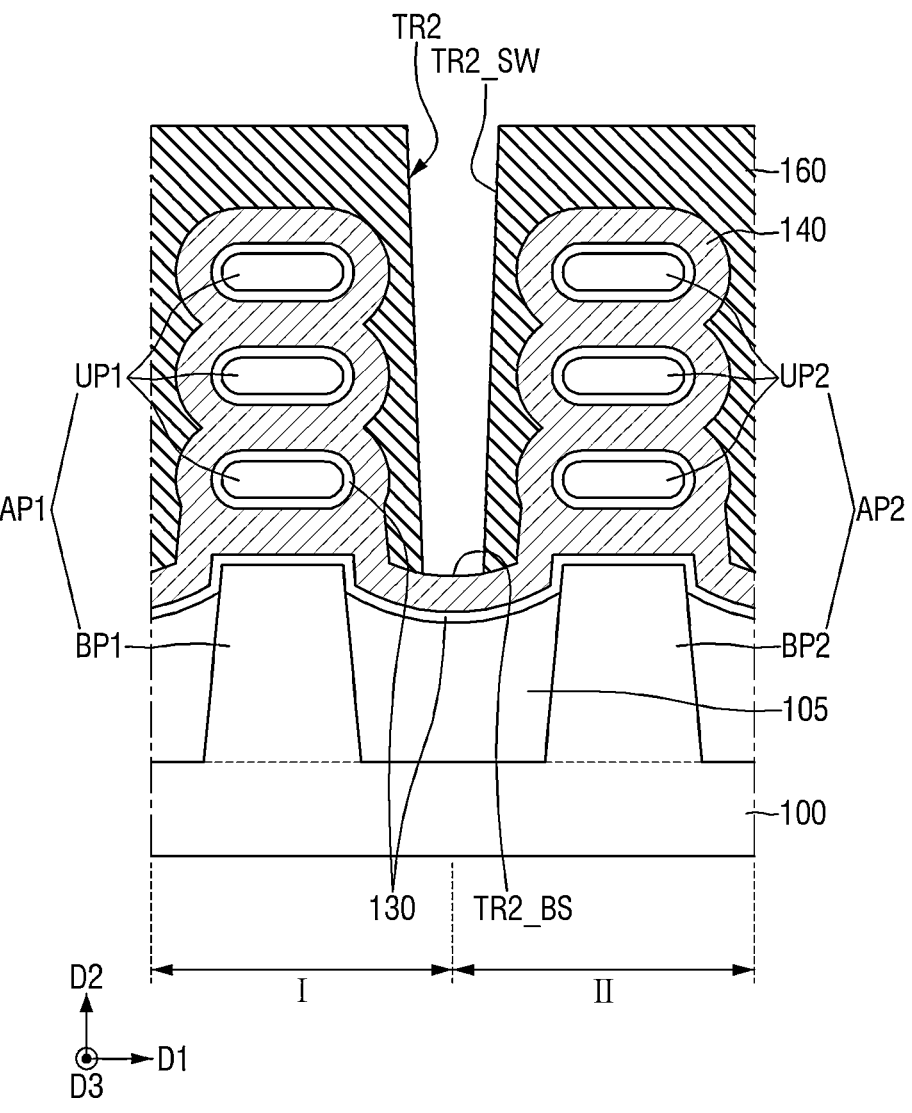

Referring to FIG. 11, a second trench TR2 may be formed using the first photoresist PR1 as a mask.

The sacrificial layer 160 may be partially removed through a dry etching process such as a reactive ion etching (RIE) process. The second trench TR2 is formed by etching the sacrificial layer 160 in the second direction D2. The second trench TR2 is illustrated as being formed at a boundary between the first region I and the second region II. However, this is merely for ease of description, and embodiments are not limited to this case.

The second trench TR2 may include side surfaces TR2 SW and a bottom surface TR2_BS. The second trench TR2 may expose a surface of the work function metal layer 140 and a surface of the sacrificial layer 160. The bottom surface TR2_BS of the second trench TR2 exposes the surface of the work function metal layer 140. The side surface TR2 SW of the second trench TR2 exposes the surface of the sacrificial layer 160.

Figure 12:
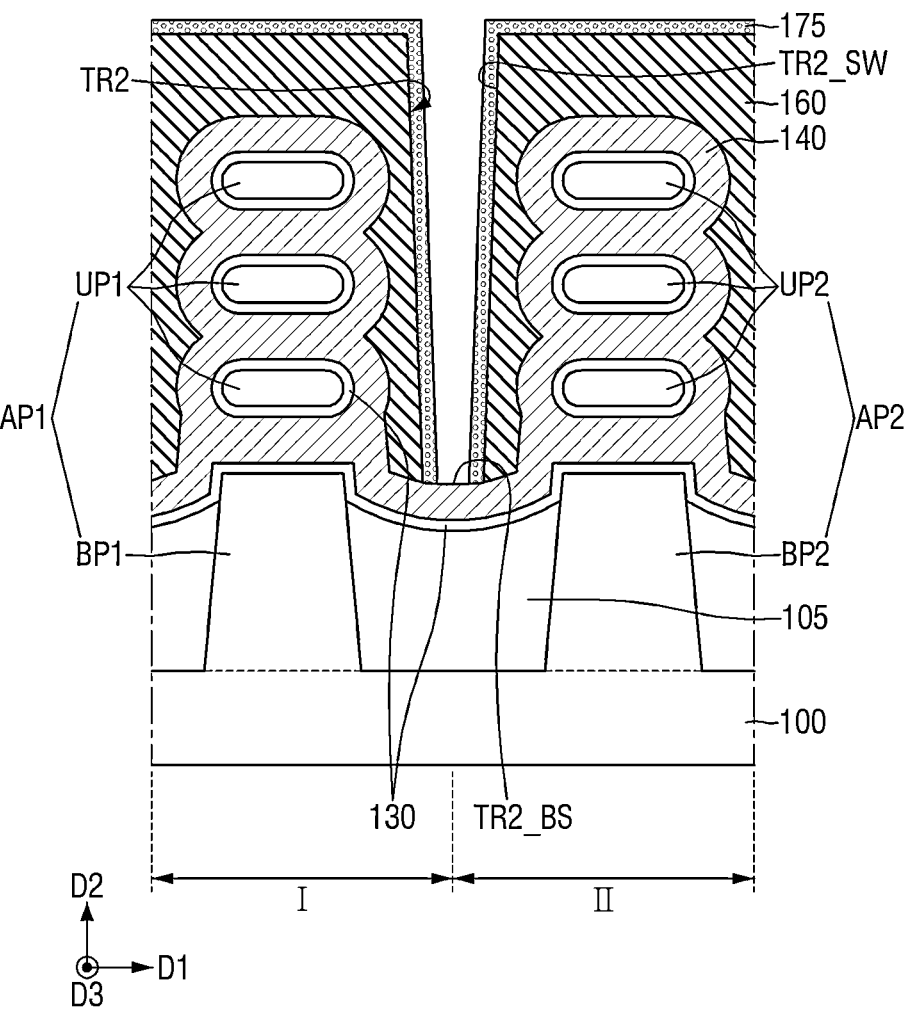

Referring to FIG. 12, a protective film 175 may be formed on the sacrificial layer 160.

The protective film 175 may include silicon oxide. The protective film 175 may be selectively formed on the protective layer 160. The protective film 175 may not be formed on the work function metal layer 140 exposed by the bottom surface TR2_BS of the second trench TR2.

The protective film 175 may be or may correspond to the silicon oxide layer 35 of FIG. 4. The protective film 175 may be selectively formed only on the sacrificial layer 160 using the first precursor including an alkoxy group and silicon., and may not form on the bottom surface TR2_BS. The protective film 175 may be formed using the first precursor including an alkoxy group and silicon, acid or hydrogen ions emitted by the sacrificial layer 160, and an amine. For example, when the sacrificial layer 160 includes an amine, the work function metal layer 140 may be exposed between the protective films 175 within the second trench TR2.

Figure 13:
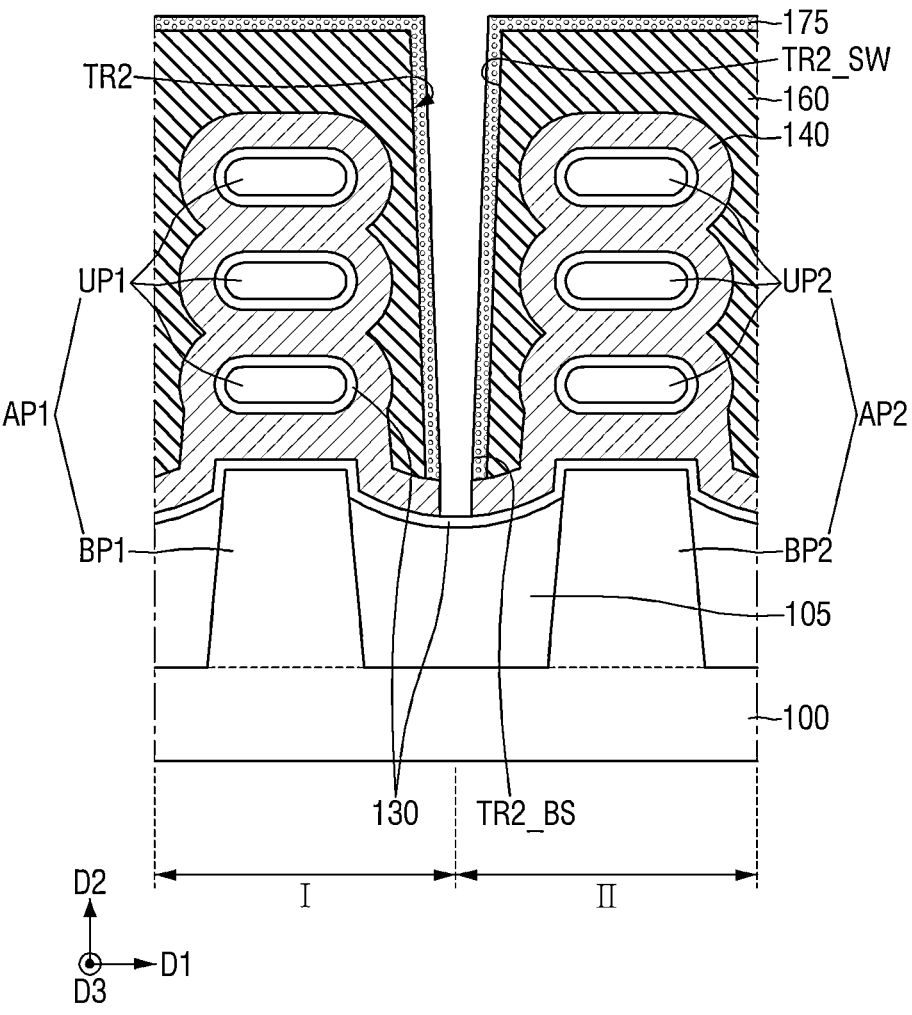

Referring to FIG. 13, the gate insulating film 130 may be exposed by partially removing the work function metal layer 140.

For example, the work function metal layer 140 on the first region I may be isolated from the work function metal layer 140 on the second region II. The work function metal layer 140 may be removed using an isotropic etching process such as using wet etching process. Thus, the work function metal layer 140 may be removed through isotropic etching.

In some example embodiments, the width of the open second trench TR2 in the first direction D1 may be reduced by using the protective film 175. Accordingly, only a small amount of etchant may permeate into the work function metal layer 140.

Figure 14:
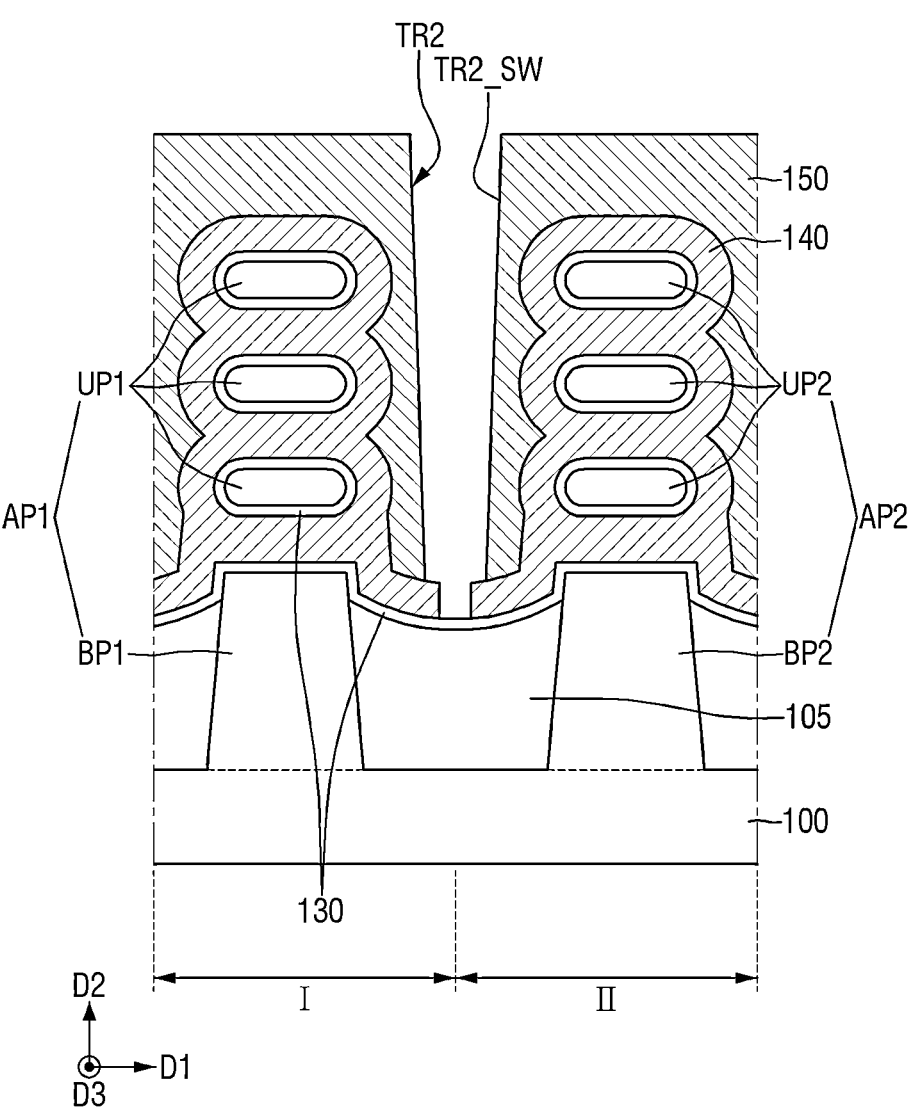

Referring to FIG. 14, the gap-fill insulating material in the protective film 175 and the sacrificial layer 160 may be removed.

The coating layer 150 may be formed by removing the gap-fill insulating material in the sacrificial layer 160. The surface of the coating layer 150 may be exposed by removing the protective film 175. A portion of the work function metal layer 140 and a portion of the gate insulating film 130 may be exposed by the second trench TR2.

The gap-fill insulating material in the protective film 175 and the sacrificial layer 160 may be removed by using a wet etching process and/or an ashing process. However, example embodiments are not limited to this case.

Figure 15:
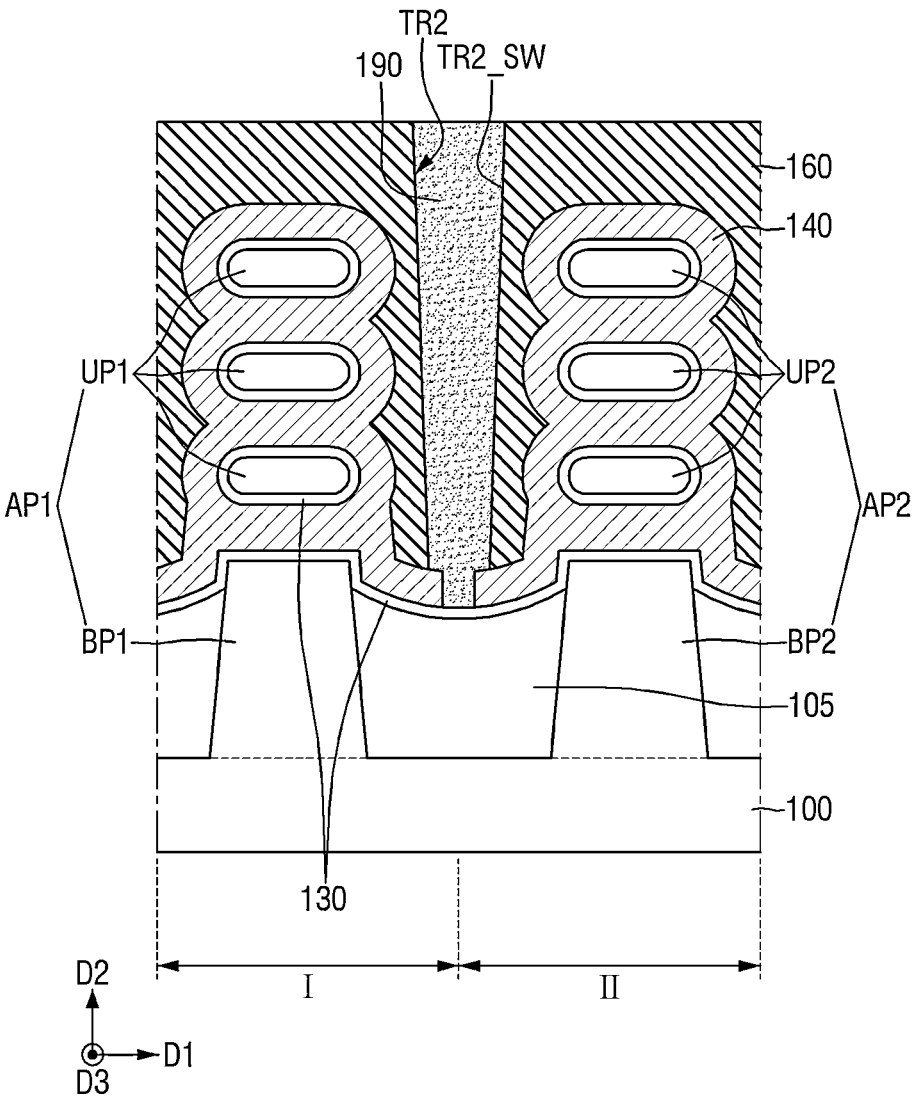

Referring to FIG. 15, a gap-fill insulating layer 190 may be formed on the substrate 100.

The gap-fill insulating material may be applied onto the substrate 100. The applied gap-fill insulating material may be combined with the coating layer to form the sacrificial layer 160. The gap-fill insulating material may be filled in the second trench TR2. The gap-fill insulating material may be filled in the second trench TR2 to form the gap-fill insulating layer 190. For example, the gap-fill insulating layer 190 may cover or at least partially cover the exposed gate insulating film 130 and the exposed work function metal layer 140.

The gap-fill insulating layer 190 may include, for example, an insulating material. As another example, the gap-fill insulating layer 190 may be a dry etch resistance layer or a wet etch resistance layer, but is not limited thereto.

Referring to FIG. 16, a second photoresist PR2 may be formed on the sacrificial layer 160 and the gap-fill insulating layer 190.

The second photoresist PR2 may cover the sacrificial layer 160 on the second region II, a portion of the sacrificial layer 160 on the first region I, the gap-fill insulating layer 190.

The second photoresist PR2 may be formed of at least one of a photoresist film, an ACL, an SOH layer, a SOC layer, and/or a silicon nitride film.

Thereafter, the gap-fill insulating material in the sacrificial layer 160 may be removed by using the second photoresist PR2 as a mask. The coating layer 150 may be formed by removing the gap-fill insulating material in the sacrificial layer 160. The gap-fill insulating material in the sacrificial layer 160 may be removed by using a dry etching process, but example embodiments are not limited to this case.

Figure 17:
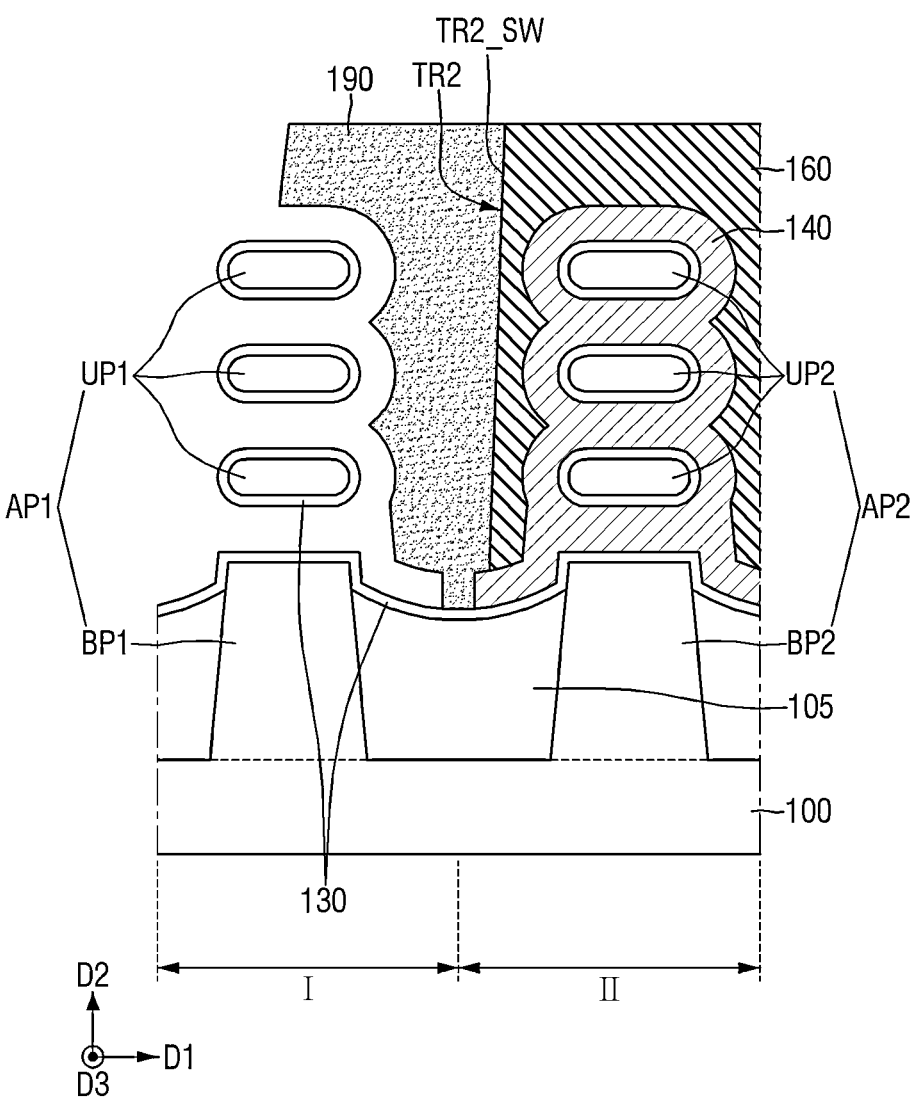

Referring to FIG. 17, the coating layer 150 and the work function metal layer 140 of the first region I may be removed. The coating layer 150 of the first region I may be selectively removed.

The coating layer 150 and the work function metal layer 140 of the first region I may be removed by using a wet etching process. When the wet etching process is used, the coating layer 150 and the work function metal layer 140 may be removed while the gap-fill insulating material and the gap-fill insulating layer 190 may not be removed. The etchant used in the wet etching process cannot penetrate through the gap-fill insulating material and the gap-fill insulating layer 190. Accordingly, the etchant cannot or is unlikely to reach the sacrificial layer 160 of the second region II. The sacrificial layer 160 of the second region II may not be removed.

For example, the coating layer 150 and the work function metal layer 140 of the first region I may be selectively removed.

Figure 18:
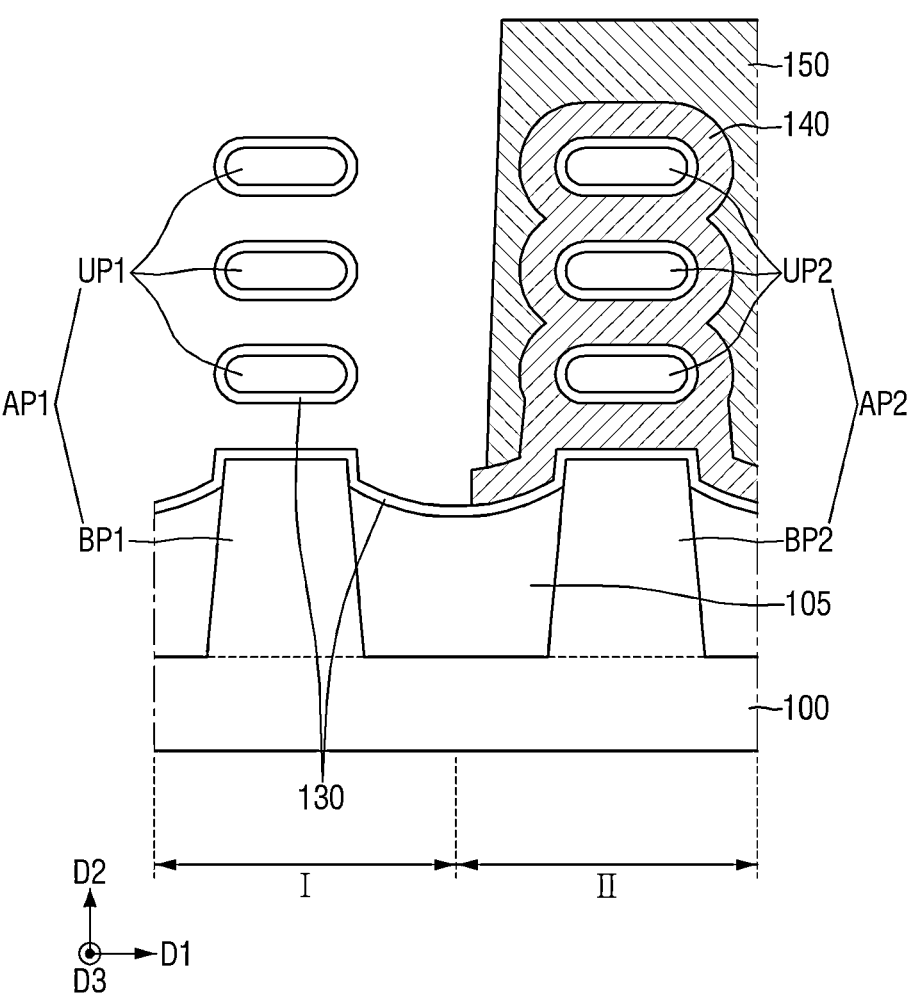

Referring to FIG. 18, the gap-fill insulating layer 190 and the gap-fill insulating material in the sacrificial layer 160 of the second region II may be removed.

The coating layer 150 may be formed by removing the gap-fill insulating material in the sacrificial layer 160 of the second region II. The gap-fill insulating layer 190 and the gap-fill insulating material in the sacrificial layer 160 of the second region may be removed by using a wet etching process or an ashing process, but example embodiments are not limited to this case.

In some example embodiments, through the above-described process, the entire work function metal layer 140 on the first region I is removed, but the work function metal layer 140 on the second region II is not removed. The gate insulating film 130 surrounding the first sheet pattern UP1 may be exposed, and the gate insulating film 130 surrounding the second sheet pattern UP2 may not be exposed.

In some example embodiments, an NMOS may be formed in the first region I and a PMOS may be formed in the second region II, but embodiments are not limited to this case.

In concluding the detailed description, those of ordinary skill in the art will appreciate that many variations and modifications may be made to various example embodiments without substantially departing from the principles of the present invention. Therefore, example embodiments are used in a generic and descriptive sense only and not for purposes of limitation. Furthermore example embodiments are not necessarily mutually exclusive with one another. For example, some example embodiments may include one or more features described with reference to one or more figures, and may also include one or more features described with reference to one or more other figures.

What is claimed:

1. A method of fabricating a semiconductor device, comprising:
    forming a first layer which has a first surface, does not comprise an acid, and comprises a metal material;
    forming, on the first layer, a second layer which defines a trench exposing the first surface, has a second surface intersecting the first surface within the trench, and comprises an acid and an organic material;
    providing a first precursor comprising an alkoxy group and silicon; and
    forming a third layer comprising silicon oxide on the second surface within the trench,
    wherein the third layer is in contact with a portion of the first surface within the trench.

2. The method of claim 1, wherein the forming of the third layer is performed at a temperature of 130° C. or higher and 250° C. or lower.

3. The method of claim 1, further comprising:
    providing a second precursor comprising an amine before forming the third layer.

4. The method of claim 3, wherein the second layer does not comprise an amine.

5. The method of claim 3, wherein
    the forming of the third layer comprises forming a fourth layer comprising a silanol on the first surface, and
    the second precursor comprises Si—N bonds.

6. The method of claim 5, wherein a thickness of the fourth layer is less than a thickness of the third layer.

7. The method of claim 1, wherein the first surface comprises a first portion in contact with the third layer and a second portion not in contact with the third layer.

8. The method of claim 1, wherein the second layer comprises an amine.

9. The method of claim 8, wherein the first precursor does not comprise an amine.

10. The method of claim 1, wherein the first precursor comprises any one of tetramethyl orthosilicate, tetraethyl orthosilicate, (3-Aminopropyl) trimethoxysilane, (3-Aminopropyl) triethoxysilane, (3-mercaptopropyl) trimethoxysilane, tetramethylsilanediamine, and (3-mercaptopropyl) triethoxysilane.

11. A method of fabricating a semiconductor device, comprising:
    forming, on a titanium nitride layer, an organic layer comprising an acid-precursor and an amine;
    forming a trench that exposes the titanium nitride layer by etching the organic layer;
    providing a first precursor comprising an alkoxy group and silicon; and
    forming a silicon oxide layer on the organic layer,
    wherein the forming of the silicon oxide layer comprises forming a first material comprising a silanol by using hydrogen ions produced from the organic layer and the first precursor and forming a second material comprising siloxane using the first material and the amine of the organic layer.

12. The method of claim 11, wherein the forming of the silicon oxide layer is performed at a temperature of 130° C. or higher and 250° C. or lower.

13. The method of claim 11, wherein the silicon oxide layer is in contact with a portion of the titanium nitride layer within the trench and the titanium nitride layer is exposed between the silicon oxide es layer within the trench.

14. The method of claim 11, further comprising:
    providing a second precursor comprising an amine before forming the silicon oxide layer.

15. The method of claim 14, wherein the second precursor further comprises silicon.

16. The method of claim 14, further comprising:
    forming a sub-film comprising a silanol on the titanium nitride layer,
    wherein the second precursor comprises Si—N bonds and a thickness of the sub-film is less than a thickness of the silicon oxide layer.

17. The method of claim 14, further comprising:
    providing a third precursor comprising an amine before forming the silicon oxide layer,
    wherein the second precursor does not comprise Si—N bonds and the third precursor comprises Si—N bonds.

18. A method of fabricating a semiconductor device, comprising:
    providing a substrate comprising a first region and a second region;
    forming a first sheet pattern on the substrate in the first region;
    forming a second sheet pattern on the substrate in the second region;

forming, on the substrate, a work function metal layer surrounding the first sheet pattern and the second sheet pattern;

forming, on the substrate, a sacrificial layer covering the first sheet pattern and the second sheet pattern and comprising an acid-precursor and an amine;

forming, between the first sheet pattern and the second sheet pattern, a trench penetrating the sacrificial layer, the trench exposing the work function metal layer; and forming, on the sacrificial layer, a protective film comprising silicon oxide, wherein the protective film covers a surface of the sacrificial layer and the work function metal layer is exposed between the protective film within the trench.

19. The method of claim 18, further comprising:

removing the work function metal layer exposed between the protective film within the trench.

20. The method of claim 18, wherein an NMOS is formed on the substrate in the first region and a PMOS is formed on the substrate in the second region.

\* \* \* \* \*